United States Patent
Ng et al.

(10) Patent No.: US 11,206,014 B1
(45) Date of Patent: Dec. 21, 2021

(54) DIGITAL FREQUENCY DITHERING FOR SWITCHED-MODE POWER SUPPLIES (SMPS) USING TRIANGULAR, ASYMMETRIC CUBIC, OR RANDOM CUBIC SPREAD SPECTRUM OSCILLATORS

(71) Applicant: High Tech Technology Limited, Hong Kong (HK)

(72) Inventors: Chik Wai (David) Ng, Hong Kong (HK); Wai Kit (Victor) So, Hong Kong (HK); Yuanzhe (Kevin) Xu, Hong Kong (HK); Ka Lok (Roy) Ng, Hong Kong (HK); Tin Ho (Andy) Wu, Hong Kong (HK)

(73) Assignee: High Tech Technology Limited, Hong Kong (HK)

( * ) Notice: Subject to any disclaimer, the term of this patent is extended or adjusted under 35 U.S.C. 154(b) by 0 days.

(21) Appl. No.: 17/241,287

(22) Filed: Apr. 27, 2021

(51) Int. Cl.
| | |
|---|---|
| H03K 5/00 | (2006.01) |
| H03K 5/1252 | (2006.01) |
| G06F 1/04 | (2006.01) |
| G11C 19/28 | (2006.01) |
| H03K 5/003 | (2006.01) |
| H03K 5/24 | (2006.01) |

(52) U.S. Cl.
CPC ............. *H03K 5/1252* (2013.01); *G06F 1/04* (2013.01); *G11C 19/28* (2013.01); *H03K 5/003* (2013.01); *H03K 5/00006* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 5,488,627 | A | 1/1996 | Hardin et al. |
| 5,757,338 | A | 5/1998 | Bassetti et al. |
| 7,289,582 | B2 | 10/2007 | Jang et al. |
| 7,423,494 | B1 | 9/2008 | Xin-LeBlanc |

(Continued)

OTHER PUBLICATIONS

Fabio Pareschi, Riccardo Rovatti, and Gianluca Setti, "EMI Reduction via Spread Spectrum in DC/DC Converters: State of the Art, Optimization, and Tradeoffs," IEEE Access, vol. 3, pp. 2857-2874, Dec. 28, 2015.

*Primary Examiner* — Tuan T Lam
(74) *Attorney, Agent, or Firm* — Stuart T. Auvinen; gPatent LLC

(57) ABSTRACT

A modulator spreads the spectrum of a generated clock to reduce Electro-Magnetic Interference (EMI). A capacitor is charged by a variable current to generate a ramp voltage that is compared to a reference to end a clock cycle and discharge the capacitor. An up-down counter drives a Digital-to-Analog Converter (DAC) that controls the variable charging current to provide triangle modulation. A smaller offset current is added or subtracted for cubic modulation when the up-down counter reaches its minimum count. A frequency divider that clocks the up-down counter also clocks a Linear-Feedback Shift-Register (LFSR) to that controls pseudo-random current sources that further modulate variable current and frequency. The LFSR is clocked with the up-down counter to modulate each frequency step, or only at the minimum count to randomly modulate at the minimum frequency. Binary-weighted bits from the up-down counter to the DAC are swapped to modulate the frequency step size.

20 Claims, 10 Drawing Sheets

(56) References Cited

U.S. PATENT DOCUMENTS

| | | | |
|---|---|---|---|
| 7,489,529 B2 | 2/2009 | Yang | |
| 7,684,462 B2* | 3/2010 | Ye | H02M 3/156 |
| | | | 375/130 |
| 8,188,798 B1 | 5/2012 | Leung et al. | |
| 8,248,127 B2 | 8/2012 | Chan et al. | |
| 8,253,468 B2* | 8/2012 | Nakagawara | H03K 4/502 |
| | | | 327/291 |
| 8,350,631 B1* | 1/2013 | Wadhwa | H03K 4/502 |
| | | | 331/111 |
| 8,692,625 B2* | 4/2014 | Sinitsky | H03K 4/502 |
| | | | 331/143 |
| 9,166,471 B1* | 10/2015 | Levesque | H02M 1/44 |
| 2004/0090802 A1* | 5/2004 | Pourseyed | H02M 3/156 |
| | | | 363/39 |
| 2004/0183511 A1* | 9/2004 | Dening | H03K 7/08 |
| | | | 323/282 |
| 2012/0126901 A1* | 5/2012 | Leung | H03L 7/08 |
| | | | 331/17 |

* cited by examiner

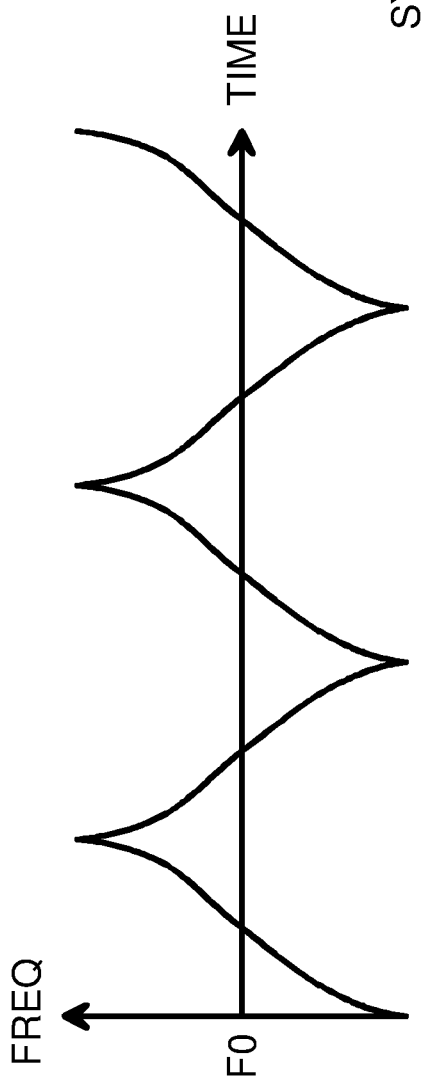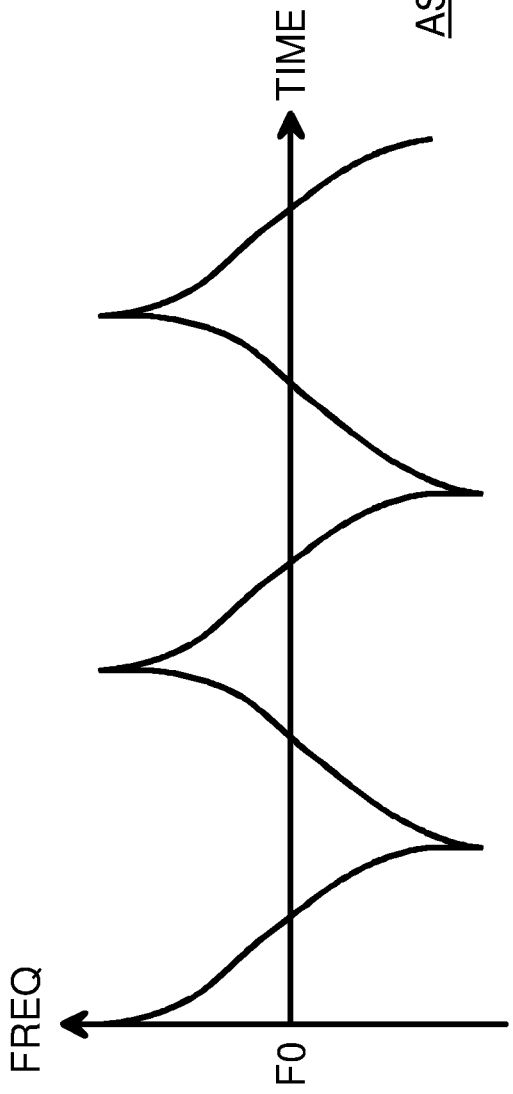

DIGITAL FREQUENCY DITHERING FOR SWITCHED-MODE POWER SUPPLIES (SMPS) USING TRIANGULAR, ASYMMETRIC CUBIC, OR RANDOM CUBIC SPREAD SPECTRUM OSCILLATORS

FIELD OF THE INVENTION

This invention relates to spread-spectrum oscillators, and more particularly to frequency dithering to reduce Electro-Magnetic Interference (EMI).

BACKGROUND OF THE INVENTION

Electro-Magnetic Interference (EMI) can disrupt operation of electronic circuits and systems. Various standards to limit EMI are imposed to prevent or limit electromagnetic leakage that can cause other devices to operate erratically. Manufacturers must ensure that their electronic devices meet these EMI standards.

EMI leakage is greater for high-current circuits. A Switched-Mode Power Supply (SMPS) rapidly switches a power current on and off, perhaps to mimic an Alternating Current (AC) generated by a mechanical generator, or to generate a Direct Current (DC) from an AC input. As the SMPS power transistors are switched on and off, electro-magnetic radiation can be emitted that may exceed EMI standards. Interference may also be conducted on the power lines themselves.

Filters may be added to the SMPS to reduce this EMI. Filters may include capacitors and inductors, which tend to be expensive and bulky. The size and cost of products may increase when such EMI filters are added.

Frequency dithering is often used to reduce EMI. Rather than switch the SMPS at a single narrow frequency, the switching frequency can be spread out over a somewhat wider range of frequencies. The EMI noise is then also spread out and the peak interference reduced. EMI filters may still be required, but their size and cost can be significantly reduced.

Various dithering techniques have been used. A capacitor can be charged by a current source and its voltage compared to a reference to generate a clock for switching. Additional capacitors can be switched on and off to provide dithering. However, these additional capacitors should be much smaller than the primary capacitor in order to provide a small frequency change for dithering. Matching the additional capacitors to the large capacitor can be difficult and may increase cost and area.

Voltage references or current sources may also be altered to provide dithering. However, matching to provide a small dithering step can be difficult. Changing voltage references may take time to settle and noise may be coupled into these dithering devices. It may limit the maximum dithering frequency or the change of the dithering frequency step.

Propagation delays within the dithering circuits can limit the useful bandwidth of the clock generators. The maximum frequency of the generated clock can be reduced by the dithering circuit or the change of the dithering frequency step.

What is desired is a clock generator with a dithering circuit that reduces EMI but does not add propagation delays that significantly reduce the maximum frequency of the generated clock. A digital dithering clock generator for a Switched-Mode Power Supply (SMPS) is desired. Advanced dithering is desired to provide many frequency steps that are further adjusted or randomized to further reduce peak EMI.

BRIEF DESCRIPTION OF THE DRAWINGS

FIGS. 3A-3B show frequency spreading using cubic modulation.

DETAILED DESCRIPTION

The present invention relates to an improvement in dithering clock generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
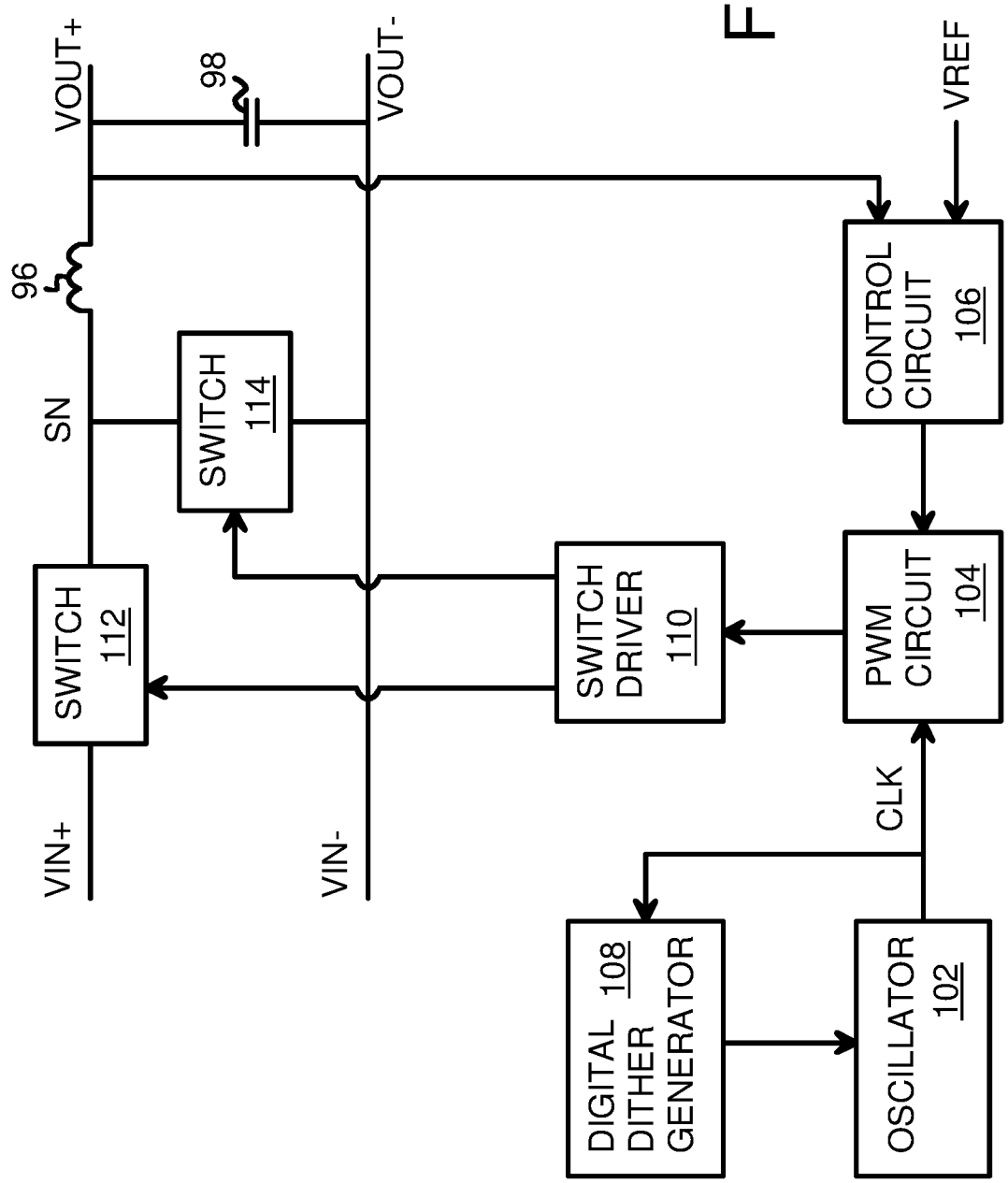
FIG. 1 shows a Switched-Mode Power Supply (SMPS) with dithering to reduce EMI.

FIG. 1 shows a Switched-Mode Power Supply (SMPS) with dithering to reduce EMI. An input power supply on VIN+, VIN− is switched by switches 112, 114 to switch node SN and filtered by series inductor 96 and filter capacitor 98 to generate an output supply on VOUT+, VOUT−. VOUT− and VIN− can be the same ground or other common supply line. During phase 1 of the switching cycle, switch 112 closes and switch 114 opens to allow power current to flow from VIN+, through inductor 96 to charge capacitor 98 to generate output voltage VOUT+. During phase 2 of the switching cycle, switch 112 opens and switch 114 closes to allow power current to flow from VIN− through inductor 96 to maintain the output current throughout the switching cycle.

Control circuit 106 monitors output voltage VOUT+ and adjusts the switching duty cycle when VOUT+ moves away from a target voltage produced by reference voltage VREF. Control circuit 106 can instruct Pulse-Width Modulation (PWM) circuit 104 to increase the duty cycle by increasing the time that switch 112 is closed and switch 114 is open within each cycle when VOUT+ falls below the target voltage. Switch driver 110 generates control signals to switches 112, 114 in response to the pulse generated by PWM circuit 104.

Oscillator 102 generates a clock CLK that sets the frequency of the pulses for PWM circuit 104. This clock is also fed back to dithering generator 108, which generates a dithering control signal to oscillator 102 that adjusts the frequency of the clock generated by oscillator 102. These frequency adjustments dither the clock by stepping the clock frequency up and down in small increments within a frequency range. These frequency adjustments from dithering generator 108 are propagated through PWM circuit 104 and switch driver 110 to slightly adjust the frequency that switches 112, 114 open and close, causing the switching frequency to be dithered over a range of frequencies. The EMI generated by switches 112, 114 on the output power line VOUT+ is thus reduced.

While analog dithering techniques are often used, dithering generator 108 is a digital circuit using counters and dividers and a Digital-to-Analog Converter (DAC). Such digital circuits typically have lower propagation delays than their equivalent analog circuits, so digital dithering generator 108 can dither high-frequency clocks.

Figure 2:
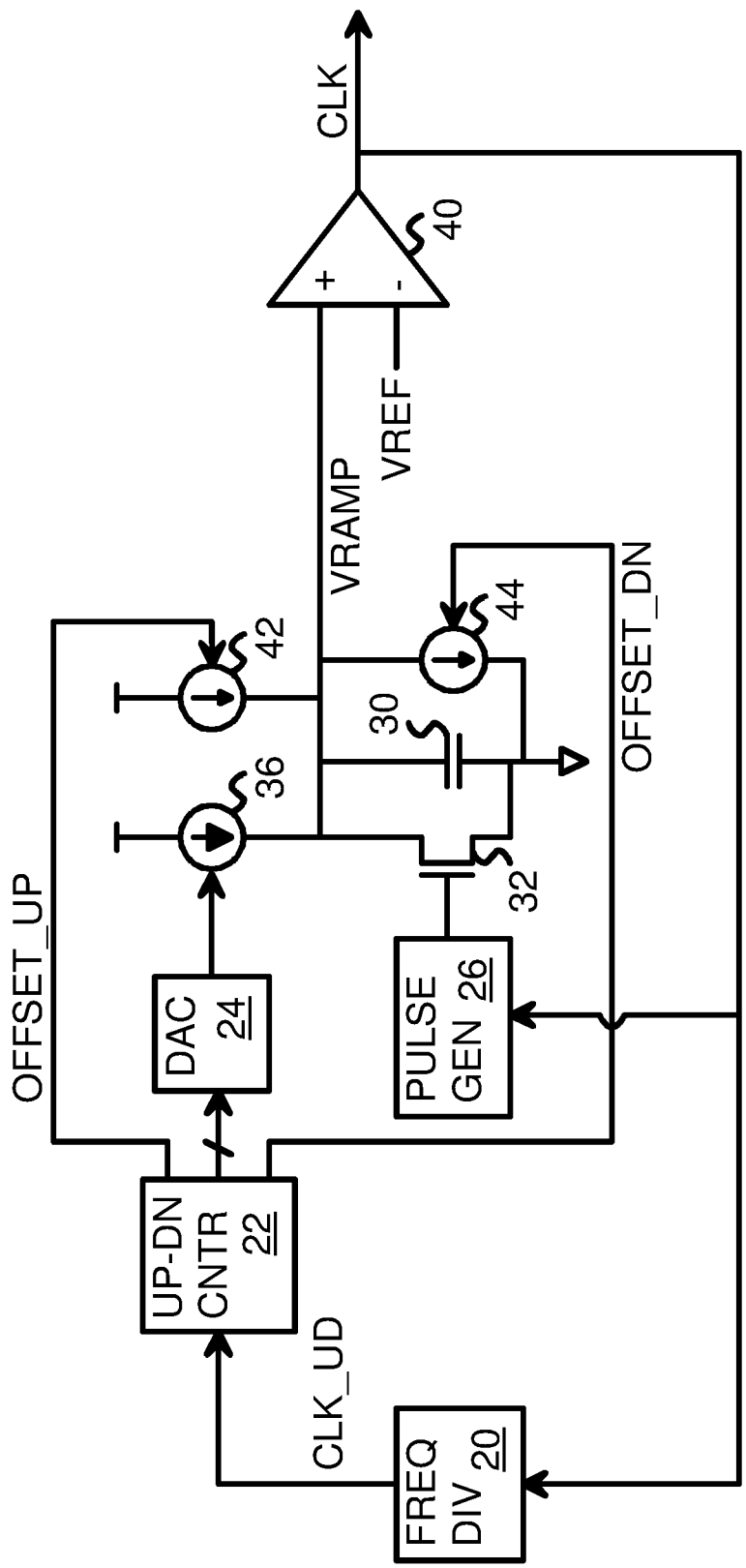
FIG. 2 is a schematic of an asymmetrical cubic-modulated spread-spectrum modulator.

FIG. 2 is a schematic of an asymmetrical cubic-modulated spread-spectrum modulator. A basic triangle wave is generated on VRAMP by current source 36 charging capacitor 30. When VRAMP rises above reference voltage VREF, comparator 40 drives CLK high, causing pulse generator 26 to generate a positive pulse to the gate of transistor 32, which turns on and discharges capacitor 30, causing VRAMP to fall toward ground. When capacitor 30 is discharged, and VRAMP falls below VREF, comparator 40 drives CLK low.

The propagation delay through pulse generated by pulse generator 26 and the discharge time of capacitor 30 determine the high time and thus the duty cycle of CLK.

The nominal frequency of CLK is dithered by additional circuitry in FIG. 2 that corresponds to dithering generator 108. The circuit shown in FIG. 2 includes both oscillator 102 and dithering generator 108 of FIG. 1.

The clock output CLK is divided by frequency divider 20 to generate up-down clock CLK_UD that clocks up-down counter 22. Up-down counter 22 generates a multi-bit count value that is input to DAC 24, which converts this count value to an analog voltage that controls the current generated by current source 36.

For example, up-down counter 22 could be a 3-bit up-down counter that counts up from 000 to 111, and then counts down from 111 to 000. Current source 36 could adjust its current to a maximum current for count 111, and to a minimum current for count 000. DAC 24 could have a narrow voltage range around a base voltage that produces a maximum voltage for an input value of 111, and a minimum voltage for an input value of 000. A total of 8 steps are introduced by a 3-bit up-down counter 22. These 8 steps cause output CLK to be spread out among 8 frequencies.

An additional frequency shift is provided by up offset current source 42 and down offset current sink 44. When counting up, down offset current sink 44 is on, increasing the charging time and decreasing the frequency of all steps. When counting down, up offset current source 42 is on, decreasing the charging time and thus increasing the frequency of all steps.

When the maximum count (111) is reached by up-down counter 22, OFFSET_UP is driven high, causing up offset current source 42 to turn on and drive an additional current to capacitor 30. This additional current from up offset current source 42 charges capacitor 30 faster, resulting in a higher frequency of CLK.

When the minimum count (000) is reached by up-down counter 22, OFFSET_UP is driven low, and OFFSET_DN is driven high. OFFSET_DN turns on down offset current sink 44. Some of the current from current source 36 is diverted through down offset current sink 44, reducing the available current to charge capacitor 30. Capacitor 30 is charged more slowly, causing a decrease in the frequency of CLK.

The frequency decrease caused by down offset current sink 44 is small, since down offset current sink 44 is much smaller than current source 36. Likewise, the frequency increase caused by up offset current source 42 is small, since up offset current source 42 is much smaller than current source 36.

Up offset current source 42 can remain on, and down offset current sink 44 remain off, when up-down counter 22 is counting down, causing all 8 frequency steps to be shifted up in frequency when up-down counter 22 is counting down, starting with the maximum frequency FMAX+, which is slightly higher than FMAX due to the extra charging current from up offset current source 42.

Down offset current sink 44 can remain on, and up offset current source 42 remain off, when up-down counter 22 is counting up, causing all 8 frequency steps to be shifted down in frequency while up-down counter 22 is counting up, starting with the minimum frequency FMIN−, which is slightly lower than FMIN due to the reduced charging current diverted through down offset current sink 44.

FIGS. 3A-3B show frequency spreading using cubic modulation. In FIG. 3A, the clock frequency is spread out around a nominal frequency F0. The waveform is roughly like a triangle wave, but has its peaks extended upward, and its minima pulled downward.

The symmetric cubic modulation waveform resembles the shape of a Hershey's kiss chocolate candy, where the top is extended. Likewise, the bottom is also pulled downward in frequency slightly. These tops correspond to the maximum frequency FMAX being extended to FMAX+ due to up offset current source 42 being turned on. The bottoms (minima) correspond to the minimum frequency FMIN being decreased slightly to FMIN− due to down offset current sink 44 being turned on.

FIG. 3B shows a waveform using asymmetric cubic modulation. The falling side of the waveform is shifted up slightly, which can be caused by OFFSET_UP remaining on while the frequency is falling from FMAX+ to FMIN. Similarly, the rising side of the waveform is shifted down slightly, which can be caused by OFFSET_DN remaining on while the frequency is rising from FMIN− to FMAX. The inventors desire to mimic the asymmetric cubic modulation waveform of FIG. 3B but using discrete frequency steps rather than a continuous function. The upper waveform of FIG. 4 shows mimicking the asymmetric cubic waveform using discrete or quantized frequency steps.

Figure 4:
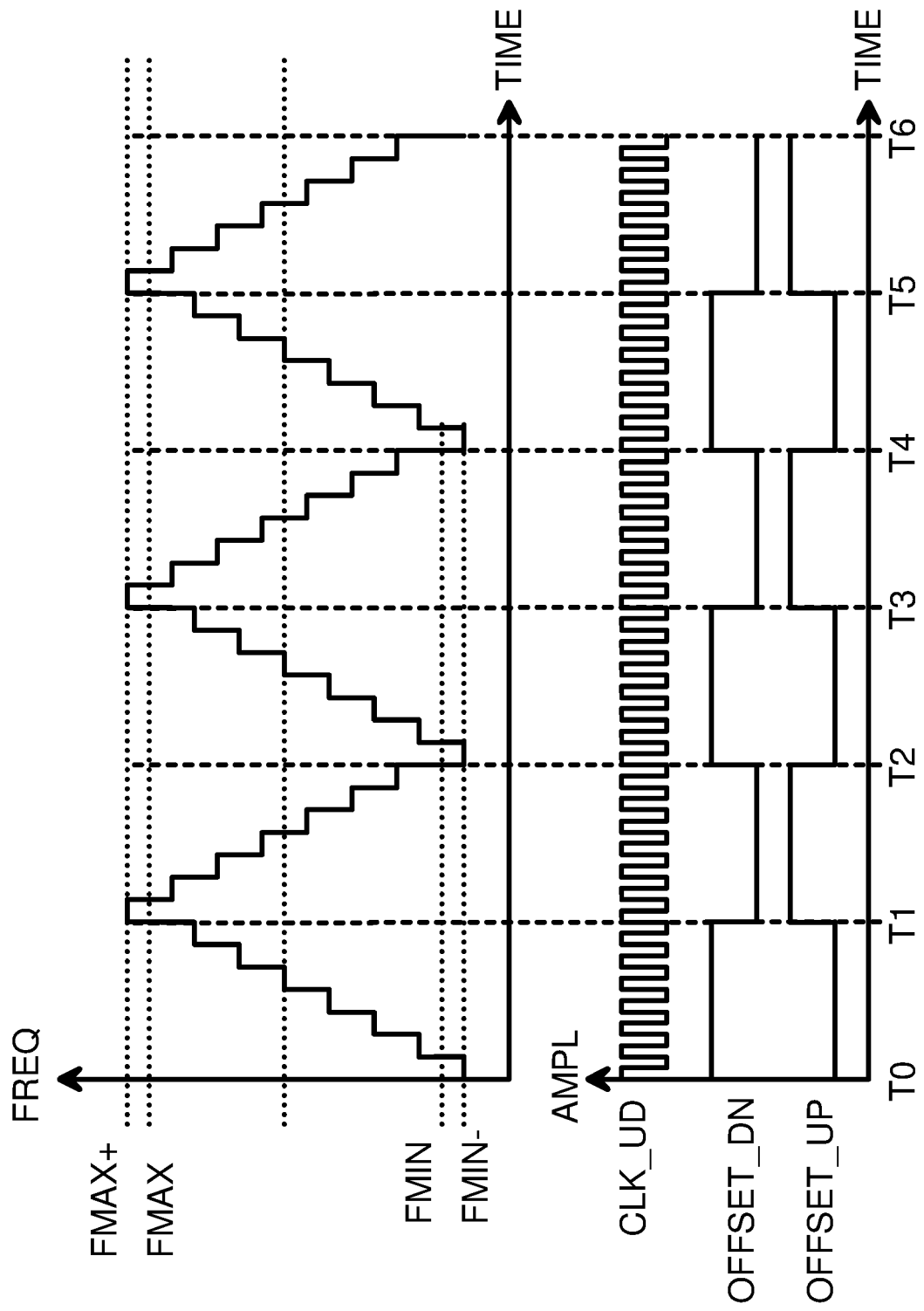
FIG. 4 is a diagram of frequency spreading for the modulator of FIG. 2.

FIG. 4 is a diagram of frequency spreading for the modulator of FIG. 2. Each rising edge of the up-down clock CLK_UD causes up-down counter 22 to change count. A count value of 000 corresponds to minimum frequency FMIN, while a count value of 111 corresponds to a maximum frequency of FMAX. Each of the 6 steps between FMIN and FMAX are equal size when up offset current source 42 and down offset current sink 44 are not used.

When the maximum count of 111 is reached near FMAX, up-down counter 22 drives OFFSET_UP high and OFFSET_DN low. OFFEST_UP high turns on up offset current source 42 turns, increasing the charging current and thus increasing the frequency slightly from FMAX to FMAX+. OFFSET_UP and up offset current source 42 remain on while up-down counter 22 counts down from 111 to 000, causing all 6 intervening falling steps to be shifted up in frequency slightly.

When the minimum count of 000 is reached near FMIN, up-down counter 22 drives OFFSET_UP low and OFFSET_DN high. OFFEST_UP low turns off up offset current source 42 while OFFSET_DN high turns on down offset current sink 44, decreasing the charging current and thus decreasing the frequency slightly from FMIN to FMIN−. OFFSET_DN and down offset current sink 44 remain on while up-down counter 22 counts up from 000 to 111, causing all 6 intervening rising steps to be shifted down in frequency slightly.

EMI is reduced due to up-down counter 22 creating 8 frequency steps from FMIN to FMAX. EMI is further reduced by up offset current source 42 shifting FMAX to FMAX+, and by down offset current sink 44 shifting FIMN to FMIN−.

Rather than ramping frequency continuously over all frequencies between FMIN and FMAX, as in an analog dithering system, the digital dithering uses discrete frequency steps. The upper and lower frequencies are also extended slightly by up offset current source 42 and down offset current sink 44, and the steps are shifted depending on whether the frequency is counting up or down. A total of 14 different frequency levels are produced.

Figure 5:
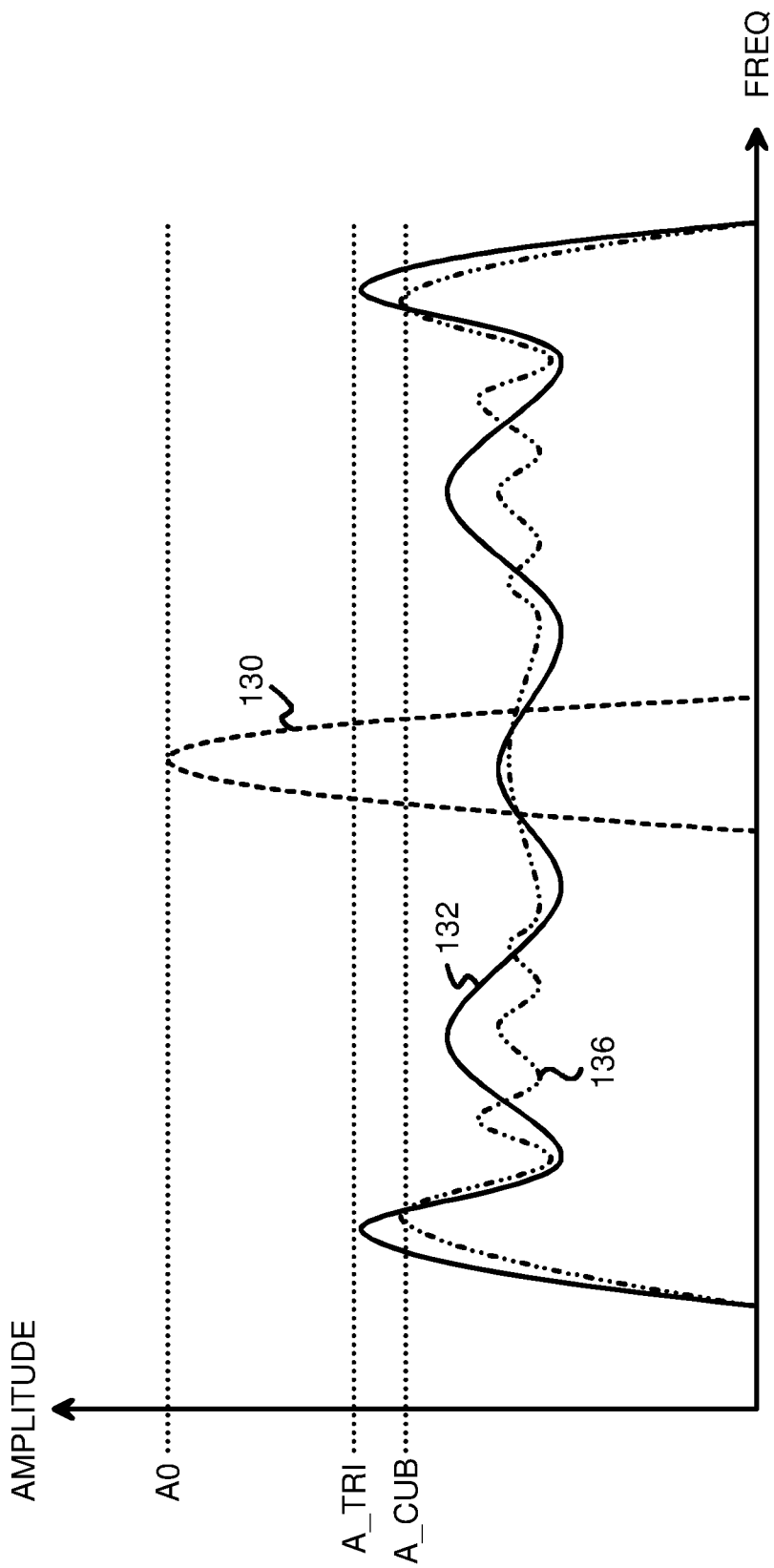
FIG. 5 shows peak EMI reduction using the modulator of FIG. 2.

FIG. 5 shows peak EMI reduction using the modulator of FIG. 2. The EMI radiation has a high peak in waveform 130 where the radiation is narrowly spread around the nominal clock frequency. The peak amplitude of waveform 130 is A0. Waveform 130 may be created by a clock generator without any spread spectrum modulation, but using a driver having the same size as comparator 40 of FIG. 2.

Waveform 132 shows that EMI is spread over a much wider frequency range when basic spread-spectrum modulation is provided, such as with a triangle-wave generated by up-down counter 22, DAC 24, and current source 36 of FIG. 2. The maximum amplitude of waveform 132, A_TRI, is lower than A0.

Waveform 136 is generated by the asymmetric cubic modulator of FIG. 2. The maximum amplitude is reduced further to A_CUB. The additional frequency steps introduced by the cubic modulation provided by up offset current source 42 and down offset current sink 44 result in more minor peaks in waveform 136 than in waveform 132, which reduces the maximum peak amplitude.

While using a simple triangle wave modulator reduces peak EMI significantly, asymmetric cubic modulation further reduces peak EMI. This additional EMI reduction can be very useful in various situations, with a relatively low additional cost to add up offset current source 42, down offset current sink 44, and their control logic.

Figure 6:
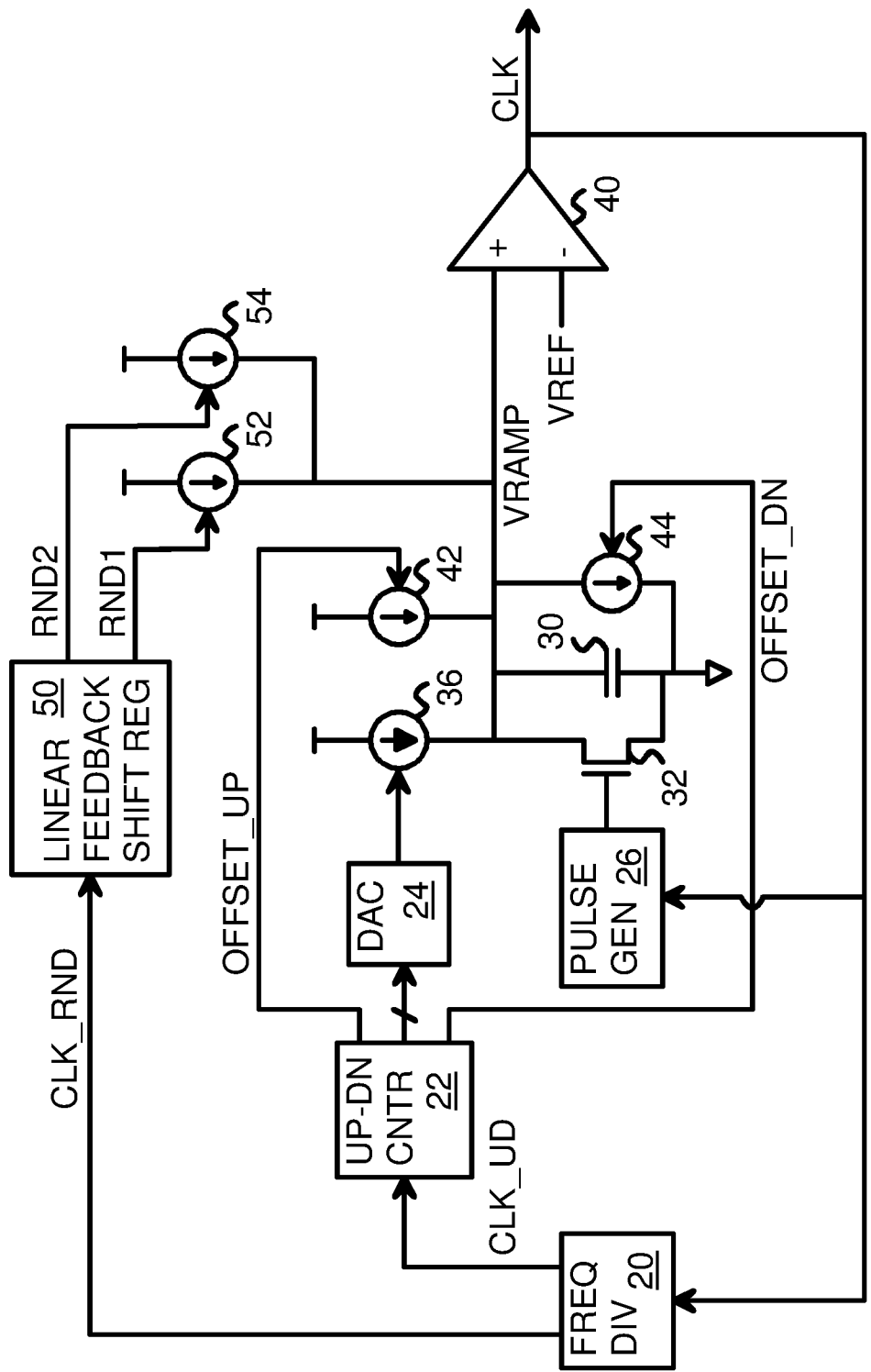
FIG. 6 shows an asymmetric-cubic modulator with pseudo-random offsets.

FIG. 6 shows an asymmetric-cubic modulator with pseudo-random offsets. Frequency divider 20 generates a second clock CLK_RND that clocks Linear-Feedback Shift-Register (LFSR) 50. LFSR 50 generates a pseudo-random sequence on its outputs RND1, RND2. When RND1 is high, first random current source 52 is activated. When RND2 is high, second random current source 54 is activated. Random current sources 52, 54 each source a small offset current that is about the same size as the offset current sourced by up offset current source 42.

The additional offset currents source by random current sources 52, 54 further add to the charging current, charging capacitor 30 more rapidly, and resulting in a higher CLK frequency. Frequency divider 20 can generate CLK_RND at the same frequency as CLK_UD, to produce the waveform of FIG. 8, or at a lower frequency, to produce the waveform of FIG. 7.

Figure 7:
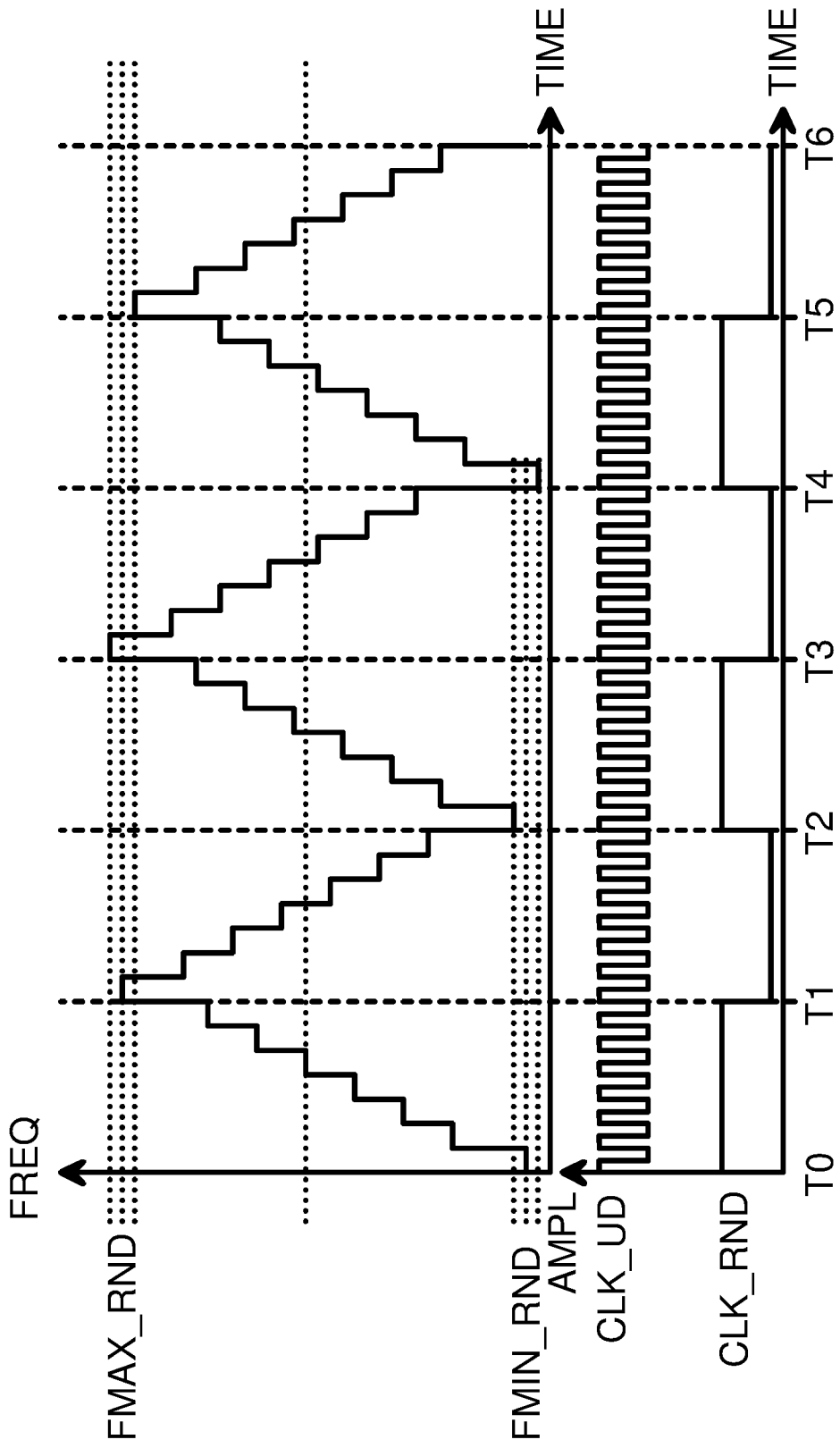
FIG. 7 shows frequency modulation for the asymmetric-cubic modulator when pseudo-random offsets are changed when the minimum frequency is reached.

FIG. 7 shows frequency modulation for the asymmetric-cubic modulator when pseudo-random offsets are changed when the minimum frequency is reached. In this embodiment, frequency divider 20 generates CLK_RND at one-sixteenth the frequency of CLK_UD. Frequency divider 20 drives CLK_RND high when FMIN is reached, when up-down counter 22 drives the minimum count of 000 to DAC 24.

The pseudo-random modulations are introduced at the bottom of the frequency spread waveform, at FMIN. Random current sources 52, 54 can be both off (00), producing the highest of the random minimum frequencies FMIN_RND, only 1 on (10 or 01), producing the middle of the FMIN_RND frequencies, or both on (11), producing the highest of the FMIN_RND frequencies.

At time T0, only one of random current sources 52, 54 are on, so CLK has a FMIN at the middle of three FMIN_RND frequencies. As CLK_UD pulses, the frequency is raised in steps until the maximum count 111 is reached at time T1. The middle of the 3 FMAX_RND frequencies is generated, since random current sources 52, 54 do not change state until the next rising edge of CLK_RND at time T2.

At time T2, the rising edge of CLK_RND clocks LFSR 50, sequencing the pseudo-random bits to another value, 11, where both of random current sources 52, 54 are turned on. This maximum random offset current produces the maximum of the 3 random frequencies FMIN_RND at time T2, and FMAX_RND at time T3. All of the intermediate frequency steps during the rising frequency steps between times T2 and T3, and all of the falling intermediate frequency steps between times T3 and T4 are shifted up by this pseudo-random offset.

At time T4, the rising edge of CLK_RND clocks LFSR 50, sequencing the pseudo-random bits to another value, 00, where both of random current sources 52, 54 are turned off. This minimum random offset current produces the minimum of the 3 random frequencies FMIN_RND at time T4, and FMAX_RND at time T5. All of the intermediate frequency steps during the rising frequency steps between times T4 and T5, and all of the falling intermediate frequency steps between times T5 and T6 are shifted down by this pseudo-random offset.

Thus the entire waveform from T2 to T4 is shifted up, and the entire waveform from T4 to T6 is shifted down, relative to the nominal waveform from T0 to T2. The waveforms are shifted up or down at the rising edge of CLK_RND, once every 16 CLK_UD periods. This additional modulation by LFSR 50 can further reduce the peak EMI generated by the modulator of FIG. 6 relative to the modulator of FIG. 2.

Figure 8:
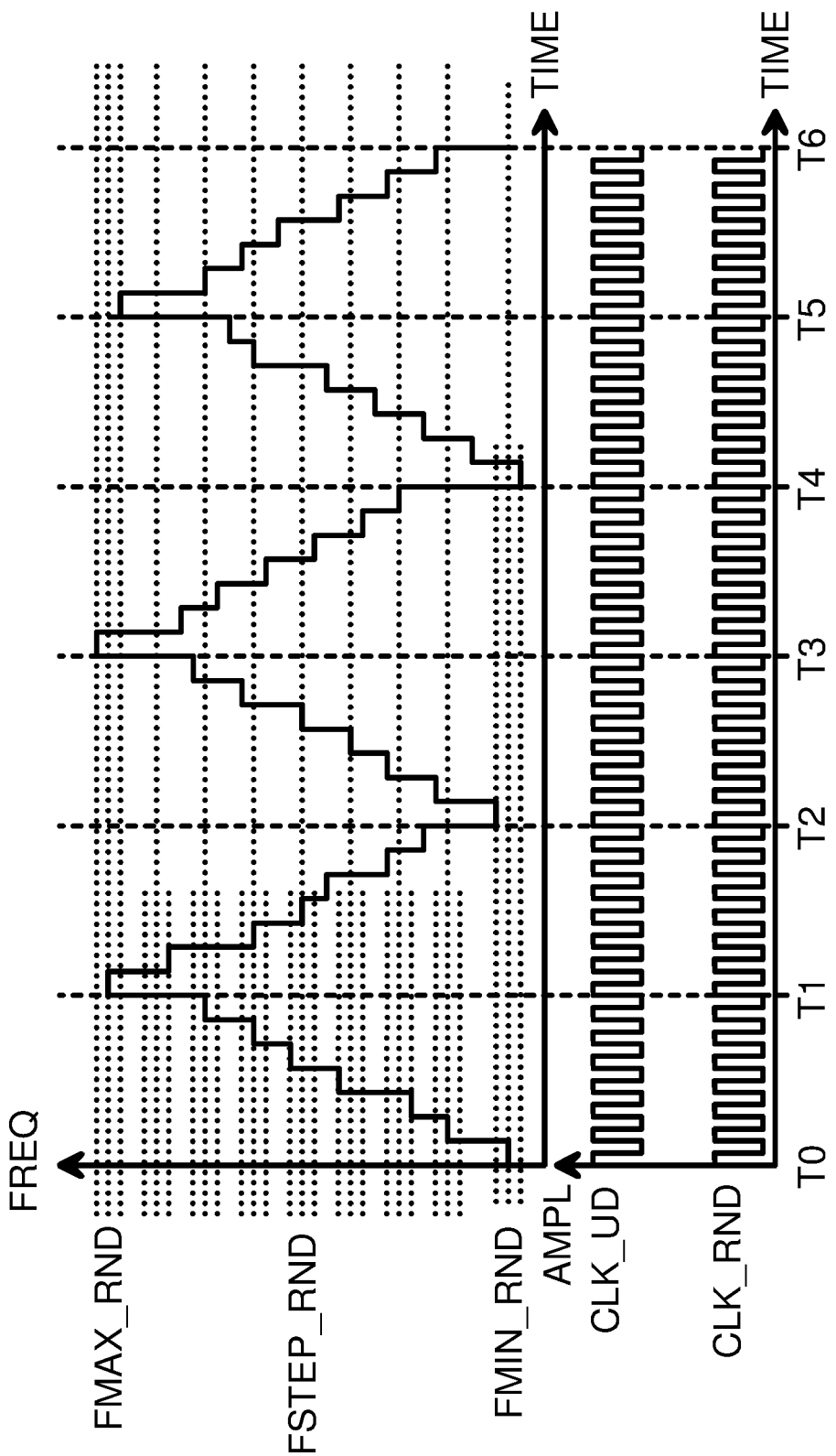
FIG. 8 shows frequency modulation for the asymmetric-cubic modulator when pseudo-random offsets are changed at each frequency step.

FIG. 8 shows frequency modulation for the asymmetric-cubic modulator when pseudo-random offsets are changed at each frequency step. In this embodiment, frequency divider 20 generates CLK_RND with the same frequency as CLK_UD.

The pseudo-random modulations are introduced at each frequency step. Each of the 14 frequency steps in the cycle from FMIN to FMAX and back to FMIN is separately modulated, producing a potentially different pseudo-random value, to control random current sources 52, 54.

For example, starting at time T0, the pseudo-random bits RND1, RND2 generated by LFSR 50 are 10, then 01, then 00, then 11, then 11, then 01, then 01, and then 10 at FMAX at time T1. The FSTEP_RND frequency steps generated (+,0,−) are 0 at T1, then 0, −, +, +, 0, 0, and finally 0 at FMAX at time T1.

This embodiment may produce a further EMI reduction, since pseudo-random modulations are introduced at a higher frequency, further reducing any regular pattern to the modulations.

Figures 9A, 9B:
FIGS. 9A-9B show swapping of counter bits.

FIGS. 9A-9B show swapping of counter bits. In FIG. 9A, up-down counter 22 generates a count value to DAC 24 using three binary-weighted bits B2, B1, B0. The Most-Significant Bit (MSB) is B2 while the Least-Significant Bit (LSB) is B0.

In FIG. 9B, bits are swapped. Up-down counter 22 outputs a binary-weighted count value on B2, B1, B0, but bits B1 and B0 are swapped before being input to DAC 24. Thus DAC 24 receives a swapped-binary input B2, X1, X0 that are bits B2, B0, B1, respectively, from up-down counter 22.

When up-down counter 22 counts up from 0 to 7, the binary values of B2, B1, B0 monotonically increase in value from 0 to 7, as shown in FIG. 9A. However, bits B1 and B0 are swapped to the binary-weighted inputs of DAC 24, so that DAC 24 sees inputs with the sequence of FIG. 9B. This sequence is not monotonically increasing.

When up-down counter 22 counts up from 0 to 7, DAC 24 will generate currents in the sequence 0, 2, 1, 3, 4, 6, 5, 7, where 0 corresponds to the smallest current and 7 corresponds to the largest current generated by DAC 24.

Figure 10:
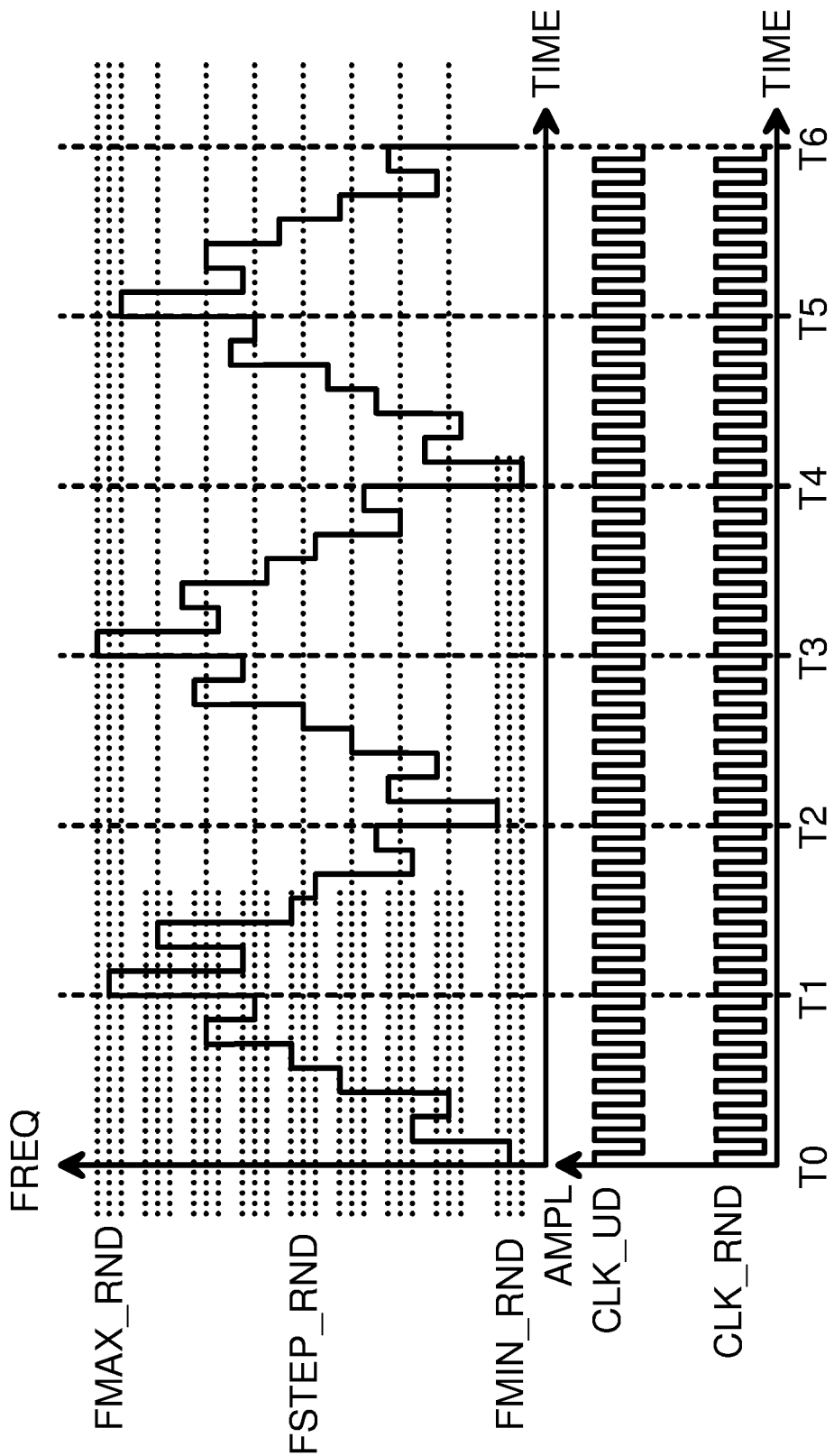
FIG. 10 shows frequency modulation for the asymmetric-cubic modulator when pseudo-random offsets are changed at each frequency step and binary bits are swapped to the DAC.

FIG. 10 shows frequency modulation for the asymmetric-cubic modulator when pseudo-random offsets are changed at each frequency step and binary bits are swapped to the DAC.

Swapping bits B1 and B0, as shown in FIG. 9B, causes DAC 24 to sequence from 0 to 2, then to 1, starting at time T0. The first step is from 0 to 2, so the first step from FMIN is large, jumping past the first set of 3 FSTEP_RND levels to the second set of FSTEP_RND levels. Then DAC sequences from 2 to 1, so the third frequency level is less than the second frequency level.

DAC 22 then sequences from 1 to 3, a jump of 2 levels. The DAC upward sequence of 0, 2, 1, 3, 4, 6, 5, 7 continues with a single-size step from 3 to 4, and then a double-size step up from 4 to 6, followed by a single-size step down from 6 to 5, and finally a double-size step up from 5 to 7, the maximum FMAX at time T1.

The downward sequence of DAC 22 is the opposite of the upward 0, 2, 1, 3, 4, 6, 5, 7, or 7, 5, 6, 4, 3, 1, 2, 0, that causes steps of sizes −2, +1, −2, −1, −2, +1, −2 to reach FMIN at time T2.

As described for FIG. 8, frequency divider 20 generates CLK_RND with the same frequency as CLK_UD. Each intermediate frequency step is pseudo-randomly modulated to one of three frequency levels FSTEP_RND. The maximum frequency FMAX is likewise modulated to one of three frequency levels FMAX_RND, and the minimum frequency FIN is likewise modulated to one of three frequency levels FMIN_RND.

The additional modulation produces by swapping bits can further reduce EMI. The larger step sizes cause by bit swapping, as well as having both up and down steps for both upward and downward sequences, may further reduce any pattern to the modulations that can cause peaks in the EMI waveform.

Alternate Embodiments

Several other embodiments are contemplated by the inventors. For example separate OFFSET_UP and OFF-SET_DN signals have been shown, but a single signal such as OFFSET_DN could be used to control both up offset current source 42 and down offset current sink 44 when an inversion occurs, such as when up offset current source 42 is implemented by a p-channel transistor and down offset current sink 44 is implemented by an n-channel transistor. Then OFFSET_DN could be applied to the gates of both the p-channel and n-channel transistors.

DAC 24 does not have to be a high precision stand-alone DAC, but could be implemented with current source 36 as parallel current sources, such as 3 binary-weighed current sources that are controlled by a 3-bit binary-weighted count value from up-down counter 22. Rather than have DAC 24 generate an analog voltage that controls current source 36, the parallel current sources could implement both DAC 24 and current source 36 without generation of the analog voltage. The digital count values from up-down counter 22 are directly converted to an analog current that charges capacitor 30 when DAC 24 and current source 36 are combined in this manner.

While up offset current source 42 and down offset current sink 44 are described as never being both on or being both off at the same time, various alternative control schemes could allow this condition to occur. Up offset current source 42 and down offset current sink 44 are described as having the same current magnitude, but could have different sizes and produce different or non-equal currents. Random current sources 52, 54 could each source a current that is about the same size as the offset current sourced by up offset current source 42, or some other current size. Random current sources 52, 54 could each source a different size current. Such non-equal currents could further reduce EMI.

Some embodiments may have only up offset current source 42 and not have down offset current sink 44. Then the frequency range is reduced to the range from FMAX+ to FMIN, since FMIN− is not generated. Similarly, the range would be reduced to FMAX to FMIN− if only down offset current sink 44 were present and up offset current source 42 was deleted.

Likewise, only one of random current sources 52, 54 may be present, controlled by a single random bit. Rather than have 3 frequencies for FSTEP_RND, FMAX_RND, and FMIN_RND, only 2 frequency values would exist for each. Additional pseudo-random bits from LFSR 50 may be added to control additional first random current sources, providing for more than 3 frequencies for each of FSTEP_RND, FMAX_RND, and FMIN_RND.

While a Linear-Feedback Shift-Register (LFSR) has been described for generating a pseudo-random sequence of RND1, RND2, other sequence generators could be substituted, such as a ROM lookup table that has the pseudo-random sequence stored therein. Many sequences of codes may be substituted for the pseudo-random code sequence generated from LFSR 50. Many code modifications can be made to the pseudo-random sequence, such as shown by swapping code bits in FIG. 9B.

The voltage input to current source 36 from DAC 24 could be inverted, such as when the analog DAC output voltage is applied to a gate of a p-channel transistor to implement current source 36. The analog voltage generated by DAC 24 could be combined with another voltage, such as by being added to a fixed voltage, to generate a bias voltage to current source 36. Many other circuit variations are possible.

Up-down counter 22 could count in a binary sequence, or in another sequence. Other encodings besides binary weighted could be used to encode the count from up-down counter 22 to DAC 24. Codes may be inverted, complemented, shifted, rotated, or other transformations. Ideal waveforms may be implemented as discrete steps rather than as continuous functions. Clocks and control signals may likewise be transformed such as by being inverted, shifted in phase, or combined with other signals such as power-down control signals. Up-down counter 22 may output CLK_RND that is synchronous and in phase with CLK_UD, or these clocks could be out-of-phase or even asynchronous to each other. OFFSET_UP could change state at FMAX rather than at FMIN, or could change state at some other time. Signals such as CLK_UD may cause blocks such as up-down counter 22 to change state on the rising edge or on the falling edge.

While FIG. 9B shows swapping the LSB and the $2^{nd}$ LSB between up-down counter 22 and DAC 24, other bits could be swapped. More than 2 bits could be swapped, and 3-way rather than 2-way bit swaps may be substituted. Bits could be transformed, operated upon, or combined during the swap.

Current source 36 may have many transistor gates connected in parallel, while up offset current source 42 has only one transistor gate, so that the total current from current source 36 is a multiple of the current from up offset current source 42. For example, current source 36 could be 8 times larger than up offset current source 42. Down offset current sink 44 could be similar to up offset current source 42 such that down offset current sink 44 and up offset current source 42 produce equal but opposite currents.

While charging and discharging of capacitor 30 has been described, the terms charging and discharging could refer to negative charge rather than to positive charge, so that capacitor 30 is discharged high to the power supply and charged low to ground, when referring to negative carriers such as electrons rather than positive charge such as holes. Capacitor 30 could be connected to a power supply or to some other fixed voltage rather than to ground, and current source 36 could source negative current from ground to capacitor 30 during charging, while transistor 32 connects capacitor 30 to power during discharge. Negative or multiple-pole power schemes could also be used. The polarity of the inputs to comparator 40 could be reversed to add an inversion, and VREF could be adjusted for various power schemes and when capacitor 30 is pre-charged rather than discharged at the end of a cycle when comparator 40 signals that the target voltage of VRAMP has been reached.

While a Switched-Mode Power Supply (SMPS) application has been described, the modulator could be useful for other applications, such as communications, digital audio processing, digital video processing, image processing, and signal quantization.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A spread-spectrum clock modulator comprising:
   a capacitor for generating a ramp voltage on a ramp node;
   a charging current generator for charging the capacitor with an adjustable current;
   a comparator for comparing the ramp voltage to a reference voltage to generate a clock;
   a discharge transistor for discharging the capacitor in response to the clock;
   a frequency divider that divides the clock to generate a divided clock;
   an up-down counter that generates a count that is sequenced in response to the divided clock, wherein the adjustable current is adjusted in response to the count; and
   an offset current generator that generates an offset current that further charges the capacitor, wherein the offset current is adjusted by a target value of the count from the up-down counter;
   wherein a frequency of the clock is modulated by the adjustable current and is further modulated by the offset current in response to the count from the up-down counter.

2. The spread-spectrum clock modulator of claim 1 wherein the offset current is less than the adjustable current;
   wherein the offset current generates smaller modulations of a frequency of the clock than the adjustable current.

3. The spread-spectrum clock modulator of claim 2 wherein the target value of the count that adjusts the offset current is a terminal count value that is a highest count value or a lowest count value of the count generated by the up-down counter,
   wherein the offset current is modulated when the up-down counter reaches the terminal count value.

4. The spread-spectrum clock modulator of claim 3 wherein the offset current generator further comprises:
   a first offset current source that generates a first offset current that decreases a charging time of the capacitor;
   a second offset current source that generates a second offset current that increases the charging time of the capacitor;

an offset control signal activated by the up-down counter when the target value of the count is reached, the offset control signal activating the first offset current source and deactivating the second offset current source to decrease the charging time of the capacitor when the offset control signal is active;

wherein the offset control signal is de-activated by the up-down counter when a second target value of the count is reached, the offset control signal deactivating the first offset current source and activating the second offset current source to increase the charging time of the capacitor when the offset control signal is not active.

5. The spread-spectrum clock modulator of claim 4 further comprising:

a Digital-to-Analog Converter (DAC) that receives the count from the up-down counter, and generates an analog voltage that is applied to the charging current generator to adjust the adjustable current in response to changes in the count.

6. The spread-spectrum clock modulator of claim 5 wherein the count generated by the up-down counter further comprises binary-weighted bits including a Least-Significant Bit (LSB) count and a higher-significance bit count;

wherein the DAC further comprises a digital input for receiving the count, the digital input comprising binary-weighted inputs including a LSB DAC input and a higher-significance bit DAC input;

wherein the LSB count from the up-down counter is applied to the higher-significance bit DAC input, and the higher-significance bit count from the up-down counter is applied to the LSB DAC input;

wherein binary-weighted bits are swapped between the up-down counter and the DAC.

7. The spread-spectrum clock modulator of claim 4 further comprising:

a second divided clock generated by the frequency divider;

a second counter that receives the second divided clock and generates a first sequenced bit and a second sequenced bit that sequence in a second sequence in response to the second divided clock;

a first sub-step current generator that generates a first sub-step current that further charges the capacitor when the first sequenced bit is activated by the second counter;

a second sub-step current generator that generates a second sub-step current that further charges the capacitor when the second sequenced bit is activated by the second counter;

wherein the first sub-step current is less than the adjustable current;

wherein the second sub-step current is less than the adjustable current;

wherein the frequency of the clock is further modulated by the second sequence of the first sub-step current and the second sub-step current.

8. The spread-spectrum clock modulator of claim 7 wherein the second counter is a Linear-Feedback Shift-Register (LFSR);

wherein the second sequence is a pseudo-random sequence;

wherein the up-down counter generates the count in a first sequence that is a binary count sequence that counts from a minimum count up to a maximum count, and then counts down from the maximum count to the minimum count before repeating;

wherein each frequency modulation level generated by the adjustable current is further sub-divided into multiple frequency levels by further modulation from the pseudo-random sequence applied to the first sub-step current generator and the second sub-step current generator.

9. The spread-spectrum clock modulator of claim 8 wherein the second divided clock has a lower frequency than the divided clock;

wherein the second divided clock has a period equal to a period of the up-down counter;

wherein all frequency modulation levels generated by the adjustable current are adjusted once for each period of the up-down counter by further modulation from the pseudo-random sequence applied to the first sub-step current generator and the second sub-step current generator.

10. The spread-spectrum clock modulator of claim 8 wherein the second divided clock has a same frequency as the divided clock;

wherein each frequency modulation level generated by the adjustable current is separately adjusted by further modulation from the pseudo-random sequence applied to the first sub-step current generator and the second sub-step current generator.

11. The spread-spectrum clock modulator of claim 4 further comprising:

a pulse generator that receives the clock and generates a pulse that is applied to the discharge transistor to discharge the capacitor.

12. The spread-spectrum clock modulator of claim 11 wherein the capacitor is connected between the ramp node and a ground;

wherein the discharge transistor is connected between the ramp node and the ground;

wherein the adjustable current generator is a current source that is connected between a power supply and the ramp node;

wherein the first offset current source is a current source that is connected between the power supply and the ramp node;

wherein the second offset current source is a current sink that is connected between the ramp node and the ground.

13. The spread-spectrum clock modulator of claim 4 further comprising a Switched-Mode Power Supply (SMPS) comprising:

a first power switch between an input power supply and an internal power node;

a second power switch between the internal power node and a ground;

a switch controller that receives the clock and generates switch control signals to the first power switch and to the second power switch;

wherein modulation of the clock reduces Electro-Magnetic Interference (EMI) from the SMPS.

14. A cubic modulator comprising:

a comparator having a first input connected to a ramp node and a second input connected to a reference, the comparator comparing the first input and the second input to generate a clock;

a capacitor connected to the ramp node;

a discharge transistor connected to the ramp node to discharge the capacitor in response to the clock;

a frequency divider that receives the clock and generates a first divided clock and a second divided clock;

an up-down counter that receives the first divided clock and generates a digital count in a counting sequence;
a current source connected to the ramp node that charges the capacitor with a variable current that is adjusted in response to the digital count;
a first offset current source connected to the ramp node that charges the capacitor with a first offset current that is activated by the up-down counter over a first sequence of values of the digital count;
a second offset current source connected to the ramp node that reduces net current charging the capacitor with a second offset current that is activated by the up-down counter when the digital count is not in the first sequence of values of the digital count;
a Linear-Feedback Shift-Register (LFSR) that receives the second divided clock and generates a first pseudo-random bit and a second pseudo-random bit;
a first pseudo-random current source connected to the ramp node that charges the capacitor with a first pseudo-random current when the first pseudo-random bit is active; and
a second pseudo-random current source connected to the ramp node that charges the capacitor with a second pseudo-random current when the second pseudo-random bit is active;
wherein the clock is modulated by the variable current in response to the digital count from the up-down counter and is further modulated by offset and pseudo-random currents.

15. The cubic modulator of claim 14 wherein the first sequence of values of the digital count are a down sequence when the up-down counter is counting down;
wherein frequency levels are shifted up in frequency due to the first offset current when the up-down counter is counting down.

16. The cubic modulator of claim 15 wherein the frequency divider generates the second divided clock to have a period equal to a period of the up-down counter;
wherein the first pseudo-random current is modulated once per cycle of the up-down counter.

17. The cubic modulator of claim 15 wherein the second divided clock is the first divided clock;
wherein the first pseudo-random current is modulated at each modulation of the variable current caused by the up-down counter.

18. The cubic modulator of claim 17 wherein the current source further comprises a Digital-to-Analog Converter (DAC) that receives the digital count from the up-down counter and generates a bias voltage to a variable current source to adjust the variable current.

19. The cubic modulator of claim 18 wherein the digital count comprises at least 3 binary-weighted bits including a Least-Significant Bit (LSB);
wherein the DAC further comprises a digital input having at least 3 binary-weighted inputs including a LSB input;
wherein the LSB of the digital count is not applied to the LSB input, but is swapped with another binary-weighted bit of the digital count that is applied to the LSB input of the DAC;
wherein frequency modulation steps include double decreasing steps and increasing steps during the down sequence when the up-down counter is counting down.

20. A clock modulator comprising:
a comparator having a first comparator input and a second comparator input and outputting a clock;
a capacitor connected to the first comparator input;
a discharge transistor connected to the first comparator input, for discharging the capacitor in response to the clock;
a frequency divider that divides the clock to generate a divided clock;
an up-down counter that is clocked by the divided clock and generates a digital count;
a Digital-to-Analog Converter (DAC) that receives the digital count and generates a bias voltage;
a current source that drives a variable current to the first comparator input, wherein the variable current is adjusted in steps by the bias voltage in response to the up-down counter being clocked;
a first offset current source that drives a first offset current to the first comparator input in response to a direction signal from the up-down counter, the direction signal indicating when the up-down counter is decreasing the digital count;
a Linear-Feedback Shift-Register (LFSR) that is clocked by the divided clock to generate pseudo-random bits; and
a first pseudo-random current source that drives a first pseudo-random current to the first comparator input in response to one of the pseudo-random bits from the LFSR;
wherein the first pseudo-random current and the first offset current are less than all values of the variable current.

* * * * *